(12) United States Patent
Wangler et al.

(10) Patent No.: US 12,176,595 B2
(45) Date of Patent: Dec. 24, 2024

(54) HIGH-FREQUENCY HIGH-VOLTAGE WAVEGUIDE DEVICE

(71) Applicant: TRUMPF HUETTINGER GMBH + CO. KG, Freiburg (DE)

(72) Inventors: Christian Wangler, March (DE); Florian A. Maier, Pfaffenweiler (DE); Roland Lodholz, Ebringen (DE)

(73) Assignee: TRUMPF HUETTINGER GMBH + CO. KG, Freiburg (DE)

( * ) Notice: Subject to any disclaimer, the term of this patent is extended or adjusted under 35 U.S.C. 154(b) by 287 days.

(21) Appl. No.: 17/840,646

(22) Filed: Jun. 15, 2022

(65) Prior Publication Data

US 2022/0320704 A1    Oct. 6, 2022

Related U.S. Application Data

(63) Continuation of application No. PCT/EP2020/086389, filed on Dec. 16, 2020.

(30) Foreign Application Priority Data

Dec. 16, 2019   (DE) .................... 10 2019 134 463.8

(51) Int. Cl.
*H01P 5/19*   (2006.01)
*H01J 37/32*  (2006.01)
*H05K 1/02*   (2006.01)

(52) U.S. Cl.
CPC .......... *H01P 5/19* (2013.01); *H01J 37/32577* (2013.01); *H05K 1/0245* (2013.01); *H05K 1/025* (2013.01); *H05K 2201/09236* (2013.01)

(58) Field of Classification Search
CPC ...... H01P 5/16; H01P 5/12; H01P 5/19; H01P 5/02; H01P 1/18; H01P 5/187; H01P 5/107; H01P 1/30; H01P 3/08; H05K 1/0237; H05K 1/0245; H05K 1/025; H05K 2201/09236; H05K 1/0265;
(Continued)

(56) References Cited

U.S. PATENT DOCUMENTS

| | | | |
|---|---|---|---|
| 2,997,675 A | 8/1961 | Anderson |
| 5,049,843 A | 9/1991 | Barnes |
| 5,723,813 A | 3/1998 | Ito |

(Continued)

FOREIGN PATENT DOCUMENTS

| | | | |
|---|---|---|---|
| CN | 1921731 A | 2/2007 |
| CN | 101604575 A | 12/2009 |

(Continued)

*Primary Examiner* — Lincoln D Donovan
*Assistant Examiner* — Tyler J Pereny
(74) *Attorney, Agent, or Firm* — LEYDIG, VOIT & MAYER, LTD.

(57) ABSTRACT

A radio-frequency high-voltage waveguide device including an electrical conductor configured for operation with a radio frequency and a high voltage relative to a gaseous environment and/or a ground body, an electrically conductive contact unit that is in contact with the conductor at at least one point, the contact unit being arranged on an electrically insulating mount, and an electrically conductive field distribution assembly arranged on the electrically conductive contact unit, the assembly being electrically conductively connected to the contact unit and arranged at least partly in an inside of the mount.

16 Claims, 4 Drawing Sheets

(58) Field of Classification Search
CPC ............ H05K 2201/09672; H05K 2201/0979; H05K 3/4644; H05K 7/20218
See application file for complete search history.

(56) References Cited

U.S. PATENT DOCUMENTS

| | | | |
|---|---|---|---|
| 6,384,540 | B1 | 5/2002 | Porter, Jr. |
| 6,545,450 | B1 | 4/2003 | Ledenev |
| 7,046,088 | B2 | 5/2006 | Ziegler |
| 7,151,422 | B2 | 12/2006 | Pivit |
| 8,791,772 | B2 | 7/2014 | Owen |
| 9,461,353 | B2 | 10/2016 | Takei |
| 10,056,922 | B1 * | 8/2018 | Tsvelykh ................... H01P 1/20 |
| 10,263,314 | B2 | 4/2019 | Grede |
| 10,541,459 | B2 | 1/2020 | Grede |
| 2006/0028305 | A1 | 2/2006 | Dutta et al. |
| 2007/0040630 | A1 | 2/2007 | Aoki |
| 2014/0349500 | A1 | 11/2014 | Siebens et al. |
| 2016/0276729 | A1 * | 9/2016 | Dang ...................... H01P 5/107 |
| 2017/0347446 | A1 * | 11/2017 | Fisné ....................... H01P 3/08 |

FOREIGN PATENT DOCUMENTS

| | | |
|---|---|---|
| CN | 104183413 A | 12/2014 |
| DE | 202010016732 U1 | 4/2011 |
| DE | 202010016850 U1 | 4/2011 |
| DE | 102012200634 A1 | 7/2013 |
| EP | 3317917 A1 | 5/2018 |
| JP | H02051306 A | 2/1990 |
| JP | H0522004 A | 1/1993 |
| JP | H08330813 A | 12/1996 |
| JP | H1166602 A | 3/1999 |
| JP | H11288816 A | 10/1999 |
| JP | 2007060030 A | 3/2007 |
| WO | WO 2011157424 A1 | 12/2011 |

* cited by examiner

HIGH-FREQUENCY HIGH-VOLTAGE WAVEGUIDE DEVICE

CROSS-REFERENCE TO PRIOR APPLICATIONS

This application is a continuation of International Application No. PCT/EP2020/086389 (WO 2021/122722 A1), filed on Dec. 16, 2020, and claims benefit to German Patent Application No. DE 10 2019 134 463.8, filed on Dec. 16, 2019. The aforementioned applications are hereby incorporated by reference herein.

FIELD

The invention relates to a radio-frequency high-voltage waveguide device comprising an electrical conductor designed for operation with a radio-frequency high voltage relative to a gaseous environment and/or relative to a ground body.

BACKGROUND

In radio-frequency technology, when e.g. power combiners and measuring units are used, difficulties occur if very high powers of approximately 10 kW or more are generated. Besides the problems with the high currents of around 10 A or more, there are additionally also problems with high peak voltages of around 1 kV or more.

In high-voltage technology, electrical components have to be able to withstand not only high currents and voltages but also high electric field strengths. High voltage here is taken to mean voltages at which an ionization of the gaseous environment at the electrical conductor or a contact unit in contact therewith would commence. This voltage cannot be delimited by a specific value since it depends very greatly on the gaseous environment, e.g. on pressure, temperature, gas composition, and moreover on the geometry of the electrical conductor and of the electrically conductive devices in contact therewith, particularly if the latter are embodied such that they lead to field increases. That can include for example tips, corners and/or edges. Such electrically conductive devices having edges occur for example in the case of securing devices of the electrical conductor. Ionization can occur at high field strengths, particularly if the high field strength occurs in a gaseous environment, for example air. This phenomenon has long been known and is described e.g. at wikipedia.org, Paschen's Law (https://de.wikipedia.org/wiki/Paschen-Gesetz) or dielectric strength (https://de.wikipedia.org/wiki/Durchschlagsfestigkeit). According to the laws researched by Paschen, an ionization arises e.g. in ambient air starting from field strengths of typically 3 kV/mm. Paschen takes a homogeneous field as a basis here. In reality, however, other geometric conditions often prevail. Firstly, the field is often not homogeneous since the electrical conductor having a high voltage has a shape that can have corners and edges. At the latter very high field strengths occur, which are often not easily determinable. Secondly, particularly in the case of a radio-frequency field, a very strong field can already occur with respect to the environment as well. Radio frequency here is taken to mean frequencies of greater than 1 MHz. Ionizations at conductors occur not only but particularly at such frequencies, even if the nearest reference potential body, i.e. electrically conductive body connected to reference ground, is very far away. That is associated with the fact that in the case of such radio-frequency oscillations, energy can also propagate in the gaseous environment, without the latter being ionized. A potential that is close to the ground reference thus arises in the environment. Discharges can arise with respect to this environment potential.

The free ions can lead to flashovers, which is highly undesirable. They can however also destroy insulators such as Teflon, for example. In this case, these insulators may change and even lose their insulating properties. The insulation clearance is shortened in this way, as a result of which voltage flashovers can arise. Precisely in the case of simple structures, such as the transition from a round tube to a flat insulator, large field strength boosts occur in the gaseous environment, in particular air.

SUMMARY

In an embodiment, the present invention provides a radio-frequency high-voltage waveguide device comprising an electrical conductor configured for operation with a radio frequency and a high voltage relative to a gaseous environment and/or a ground body, an electrically conductive contact unit that is in contact with the conductor at at least one point, the contact unit being arranged on an electrically insulating mount, and an electrically conductive field distribution assembly arranged on the electrically conductive contact unit, the assembly being electrically conductively connected to the contact unit and arranged at least partly in an inside of the mount.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present invention avoids ionizations at the electrical conductor or at electrically conductive devices fitted thereto.

This is achieved according to embodiments of the invention by means of a radio-frequency high-voltage waveguide device as described hereafter. What is disclosed is a radio-frequency high-voltage waveguide device comprising an electrical conductor designed for operation with a radio-frequency high voltage relative to a gaseous environment and/or a ground body, wherein the conductor is in contact with an electrically conductive contact unit at at least one point, said contact unit being arranged on an electrically insulating mount wherein an electrically conductive field distribution assembly is arranged on the electrically conductive contact unit, which assembly is electrically conductively connected to the contact unit. The field distribution assembly can be arranged at least partly in the inside of the mount.

The electrical conductor can be arranged at a distance from the ground body.

The electrical conductor can be arranged at least in sections in a gaseous environment, in particular without insulation. At least in sections, therefore, the electrically conductive material of the electrical conductor can thus be exposed to a gas, in particular air.

The electrically conductive field distribution assembly can be arranged between the ground body and the electrically conductive contact unit. It is thus possible to reduce the field strengths at the electrically conductive contact unit. It is thus possible to reduce the risk of an ionization.

The electrically conductive field distribution assembly can alternatively or additionally be arranged between the gaseous environment and the electrically conductive contact unit. It is thus possible to reduce the field strengths at the electrically conductive contact unit. It is thus possible to reduce the risk of an ionization. Radio frequency within the meaning of the invention is understood to mean frequencies of ≥1 MHz and ≤500 MHz.

High voltage within the meaning of the invention is understood to mean a voltage which is high enough to lead to an ionizing field strength at the radio-frequency high-voltage waveguide device. Since, as mentioned above, this voltage depends on very many environmental variables, the exact value cannot be specified. It can be stated, however, that at peak voltages of ≥1 kV these phenomena occur with very high probability. Therefore, a device which is designed for such a voltage and/or in which such a high voltage forms during operation is deemed to be a high-voltage waveguide device within the meaning of this disclosure. Said high voltage is measured in each case relative to a reference potential, for example a grounding. The power and current intensity are of secondary importance for this invention.

Ground is understood to mean an electrical reference potential, for example a grounding. The high voltage can form relative to this reference potential. The high voltage can also form relative to the gaseous environment, as has already been explained above. The ground body can have any geometric shape desired. In particular, the ground body can be configured as a plate. The ground body can have a planar area parallel to the direction of extent of the electrical conductor. In particular, the conductor can extend parallel to a plane, e.g. in a meandering fashion, and the planar area of the ground body can be arranged parallel to this plane.

The mount can be configured for holding the field distribution assembly. The mount can in particular additionally be configured for holding the electrical conductor. It can alternatively or additionally serve for holding the electrically conductive contact unit. The mount can alternatively or additionally ensure a predefined distance between the conductor and the ground body, in particular the ground plate.

The contact unit can have an, in particular metallic, coating, in particular on its surface and/or the side oriented toward the electrical conductor. The contact unit can be formed from copper. The contact unit can be configured as a printed conductor track.

The field distribution assembly can be formed in planar fashion at least in sections, in particular completely. In this way, the device according to the invention can be constructed in a particularly space-saving manner.

The field distribution assembly can have an edge and/or a tip with a thickness of ≤0.25 mm, in particular a thickness of 35 μm. In this way, the device can be constructed in a very space-saving manner. The edge and/or tip can preferably be arranged completely in the inside of the electrically insulating mount. A very high field strength of 2 kV/mm or greater can form at the edge and/or tip. If the edge and/or tip is arranged in the inside of the electrically insulating mount, the electrically insulating mount can be designed in such a way that such a high field strength does not lead to flashovers.

With the device according to the invention, in a space-saving, stable and cost-effective and also reliable manner and additionally in an easily producible manner, an electrical conductor carrying radio-frequency high voltage can be arranged in the vicinity of one or more ground bodies.

The contact unit can be configured in planar fashion at least in sections, in particular completely. The device can thus be constructed in a particularly space-saving manner.

The contact unit can have an edge and/or tip with a thickness of ≤0.2 mm, in particular ≤0.1 mm, in particular ≤0.05 mm, in particular of 35 μm. The device can thus be constructed in a very space-saving manner. Particularly if the dimensions of the field distribution assembly are made equal to or greater than those of the contact unit and/or are arranged in a manner overlapping the contact unit in plan view, the device can be configured such that fields which are less than the ionization field strength, in particular less than 3 kV/mm in the case of a gaseous environment, in particular air, form at the edge and/or tip of the contact unit. In this way, it is possible to reduce the risk of a flashover at the edge and/or the tip of the contact unit even in the case of a very thin edge and/or tip.

The mount can be configured in planar fashion at least in sections, in particular completely. In this way, the device can be constructed in a particularly space-saving manner.

The mount can have two electrically insulating mount parts. The mount parts can both be configured in planar fashion. The mount parts can have the same thickness. The mount parts can enclose between them the field distribution assembly, in particular without inclusions of gases, in particular without air inclusions. The mount can be produced and/or formed by the mount parts being pressed together.

The mount can be configured as a printed circuit board. In printed circuit board technology, a printed circuit board is often designated as PCB. The contact unit can be arranged on an outer side, in particular top side or underside, of the printed circuit board.

The field distribution assembly can be arranged in an inner layer of the printed circuit board, in particular in a manner free of inclusions of gases, in particular air inclusions. The contact unit can be electrically conductively connected to the field distribution assembly by means of one or more through contacts. In printed circuit board technology, such a through contact is also called a "via". Advantageously, provision can be made of a plurality of through contacts in the form of a matrix. That is advantageous because individual vias can break under mechanical loading and redundancy is thus created. In addition, the contact area is held more reliably on the mount. The matrix can cover 50% or more of the contact area.

The field distribution assembly can have a field distribution area in a field distribution plane. The contact unit can have a contact area in a contact plane. The areas can be arranged parallel at a distance. In particular, they can be arranged in an overlapping fashion (perpendicular to the planes), in plan view.

The field distribution area can have an area which is greater than or equal to the area of the contact area. In particular, it can have an area at least 10% greater than that of the contact area.

The electrically conductive field distribution assembly can be embedded, in particular without gas inclusions, e.g. air inclusions, into the mount. This sealed, gas-free construction can enable a dielectric strength that is more than ten times greater than that of most gaseous environments, in particular that of air. Above all it is thereby possible to ensure that the only range of field strengths greater than 2 kV/mm is situated within the mount. Thus, the parts of the radio-frequency high-voltage waveguide device which would lead to ionizations in the gaseous environment are kept free of gases in an insulating manner in the mount and cannot lead to ionization. At the same time, the radio-frequency high-voltage waveguide device is embodied such that the field distribution assembly reduces a field boost at the conductor, in particular at the points at which the conductor comes close to or is in contact with the mount and/or the contact unit, in particular reduces said field boost to an extent such that no ionizations occur in the gaseous environment.

The field distribution area can be greater than the cross-sectional area of the electrical conductor. Furthermore, the field distribution area can cover over the assigned contact area in a plan view, i.e. at all edges cover the contact area or project beyond the latter. At the very least, however, the field distribution area can project at the edges perpendicular to the current flow direction in the conductor.

The electrical conductor can have a round or oval cross section. The electric field at its surface is thus kept small enough. It is thus possible to prevent ionization from occurring at the points at which no contact unit with field distribution assembly is provided.

The electrical conductor can be configured as a tube, in particular with a round cross section. In the case of such an embodiment of the electrical conductor, a coolant can be caused to flow through the electrical conductor for cooling purposes. In principle, however, it would also be conceivable for the electrical conductor to be formed from solid material. The electrical conductor can be formed from copper.

The mount can be configured as a multilayer printed circuit board. The radio-frequency fields can lead to heating in the mount, in particular in the printed circuit board material, in particular in the printed circuit board material of the multilayer printed circuit board. Said heating can change the material, in particular the printed circuit board material, in particular change the insulating properties of said material. In order to reduce the risk of a negative change, in particular the mount can be formed from FR4 material or a lower-loss material. Low-loss material means that the material has a small loss angle tan δ (dissipation factor). FR4 has a dissipation factor of 0.017 or less (https://en.wikipedia.org/wiki/FR-4). Even printed circuit boards having a dissipation factor of 0.03 or less can take up electric field strengths and thereby reduce the electric fields in the adjoining gaseous environment, in particular air, to an acceptable level of approximately 1.1 kV/mm. The mount, in particular the printed circuit board, serves as it were as a trap of the electric field. It can also be stated that the mount, in particular the printed circuit board, serves as an electric field neutralizer.

An insulator can be arranged between the mount and the ground body. Said insulator can be formed from PTFE, for example. In particular, the insulator can be formed from a material which, in respect of radio-frequency fields, is a lower-loss material than the material of the mount, in particular of the printed circuit board. In particular, the insulator can have a lower $\varepsilon_r$ than the mount.

The insulator can have a cutout in the region of the contact area, said cutout being bridged by the insulator. In this case, a cutout is understood to mean a material-free region. Only gas, in particular air, can be present in the region of the cutout. In particular, the cutout can be a cavity or a depression. The cavity or the depression can be filled with gas, in particular with air. The cutout can have a cutout area lying in a cutout plane lying parallel to the contact plane and/or the field distribution plane. The cutout can be cylindrical or parallelepipedal, for example. The cutout area can be greater than or equal to an overlying contact area and/or field distribution area and/or can overlap the latter.

Two ground bodies can be provided and the electrical conductor can be arranged between the ground bodies, wherein the electrical conductor is in contact respectively with a contact unit on a mount at opposite points. The ground bodies can be configured as plates. The sides of the ground bodies that face one another can be parallel. In particular, the electrical conductor can be arranged between two parallel sides of two ground bodies. The electrical conductor can be clamped in between two ground bodies and insulators and can be mechanically secured in this way. In particular, the conductor can be clamped in and thus held between the ground bodies and also in particular additionally between the insulators and also in particular additionally between the mounts and also in particular additionally between the contact units. In particular, however, a conductor can also be secured to the mount and/or contact unit by means of screwing, welding, adhesive bonding, soldering, riveting, tying or other securing possibilities.

The mount can have a plurality of contact units which are in contact with the electrical conductor at different points, wherein each contact unit is assigned a field distribution assembly electrically connected thereto.

Two electrical conductors can be provided and be arranged in particular in different planes of the device, which in particular are each connected to a power terminal for radio-frequency power. The conductors can be electrically connected at their second terminal and can be connected by this connection point in particular to a coupling terminal for a coupled power signal. Such an embodiment of the device can be used in particular as a coupler (combiner) namely for coupling/combining two radio-frequency power signals.

The conductor or conductors can be designed as a so-called impedance-controlled line. That is to say that it or they have a predefined line impedance for the frequency at which they are operated, e.g. 25Ω, 50Ω, 100Ω.

There can be connected between the power terminals a balancing resistor, preferably with a resistance value equal to double the line impedance of e.g. 50Ω, 100Ω, 200Ω.

There can be connected between a plurality of power terminals a respective balancing resistor, in particular respectively from each power terminal to a contact unit point, preferably with a resistance value equal to the line impedance of e.g. 25Ω, 50Ω, 100Ω.

The electrical conductors can each have a length of λ/4 or an integer multiple of λ/4 of the radio-frequency power. In this case, λ is the wavelength of the electromagnetic wave that forms as a result of the radio frequency. The device according to the invention can thus be configured for example as a so-called Wilkinson combiner. Such a combiner enables two in-phase power signals to be coupled to form a coupled signal with double power.

A fixing unit can be provided on the contact unit, said fixing unit being designed to prevent the conductor from slipping. It can thus be ensured that the electrical conductor is always in contact with the contact unit.

Alternatively or additionally, the mount and/or the contact unit can have a shaping that receives the conductor and prevents slipping.

The contact area and/or the field distribution area can be rectangular, in particular with rounded corners. A particularly good adaptation to the conductor guided thereover can be effected as a result.

The electrical conductor preferably exclusively contacts the contact areas of the printed circuit board and is otherwise surrounded by the gaseous environment, in particular by air. The dimensions of distance between conductor and the ground body, insulator thickness, distance between insulator and field distribution assembly and/or thickness of the mount (printed circuit board) are preferably chosen such that the characteristic impedance is 1.414 (Root 2) times the line impedance, e.g. 70.7Ω. The dimensions are furthermore preferably chosen such that the electric fields in the gaseous environment are less, in particular significantly less, than 2 kV/mm. The conductor structure within the printed circuit board is preferably chosen such that the only range of field strengths greater than 2 kV/mm is situated in an inner layer of the printed circuit board. Printed circuit boards are preferably used which have a loss angle of less than or equal to 0.005 and a high dielectric strength in the range of more than 20 kV/mm, in particular of 31.2 kV/mm.

In order to avoid high electric fields, the field distribution assembly is preferably arranged at least partly in the mount at a point at which the distance from the ground body or materials to be insulated is the smallest.

Further features and advantages of the invention are evident from the following detailed description of exemplary embodiments of the invention, with reference to the figures of the drawing, which shows details essential to the invention, and also from the claims. The features shown there should be understood to be not necessarily to scale and are presented in such a way that the special features according to the invention can be made clearly visible. The various features can each be realized individually by themselves or as a plurality in any desired combinations in variants of the invention.

In the Figures

Figure 1:
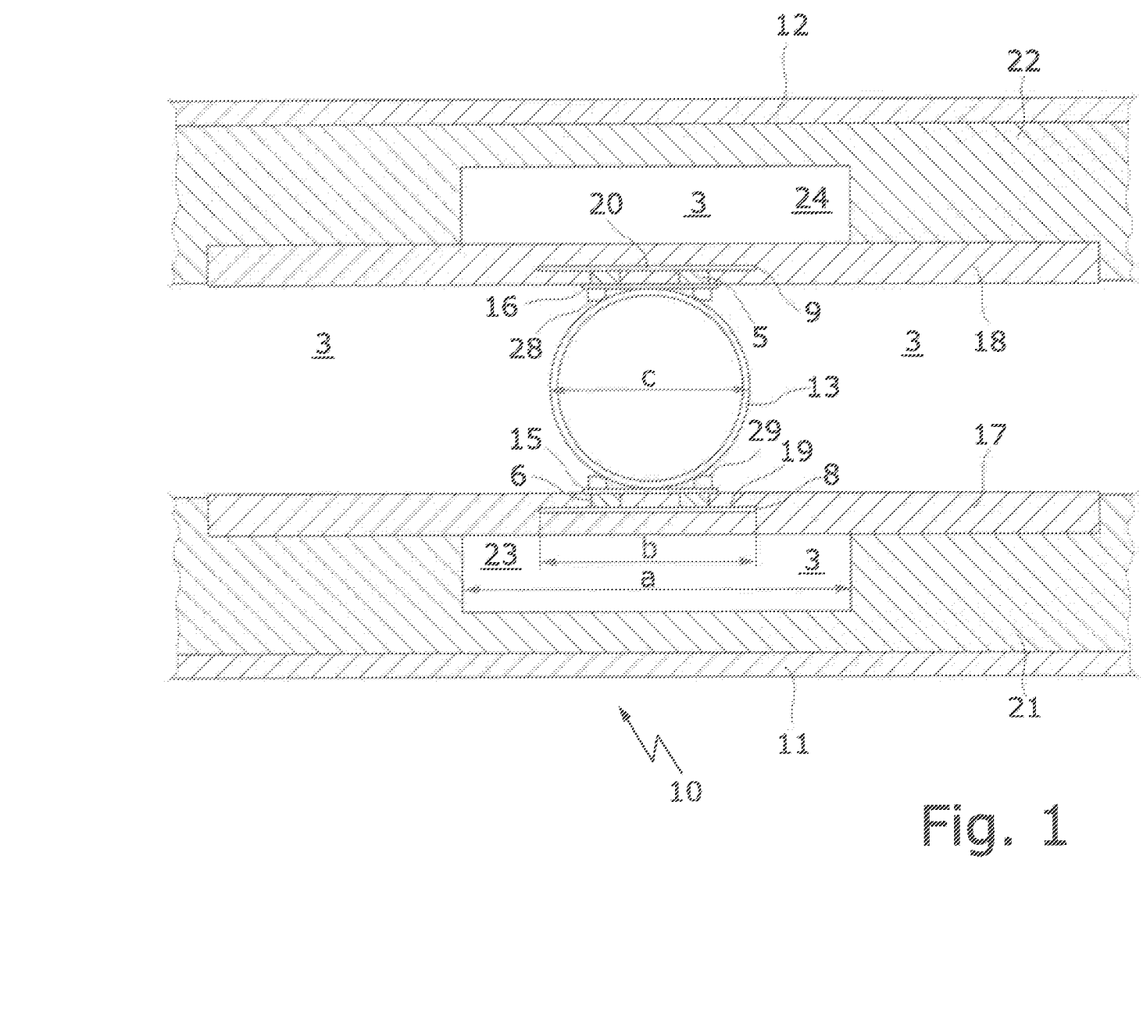
FIG. 1 shows a partial cross-sectional illustration of a device according to the invention.

FIG. 1 shows a cross-sectional illustration of part of a radio-frequency high-voltage waveguide device 10 in a gaseous environment 3. An electrical conductor 13 is arranged at a distance from the ground bodies 11, 12, said electrical conductor being configured as a circular tube in the exemplary embodiment shown. The electrical conductor 13 is configured for operation with a radio-frequency high voltage, the high voltage being present between the electrical conductor 13 and one of the ground bodies 11, 12, in particular both ground bodies 11, 12.

The electrical conductor 13 is in contact, at opposite points, with in each case an electrically conductive contact unit 15, 16, each of which is arranged on an electrically insulating mount 17, 18. A respective electrically conductive field distribution assembly 19, 20 is provided between a respective ground body 11, 12 and a respective electrically conductive contact unit 15, 16, said field distribution assembly being electrically conductively connected to a respective one of the contact units 15, 16. In the exemplary embodiment shown, the field distribution assemblies 19, 20 are arranged in the inside of the mounts 17, 18.

Electrically insulating insulators 21, 22, which can be formed from PTFE, for example, are arranged between the mounts 17, 18 and the ground bodies 11, 12. In the region of the contact units 15, 16, the insulators 21, 22 each have a cutout 23, 24, each of which is bridged by a mount 17, 18. The cutouts 23, 24 can be configured in particular as a gaseous environment 3 and can be filled in particular with air.

Fixing units 28, 29 can be provided on the contact units 15, 16, said fixing units preventing the electrical conductor 13 from slipping.

The electrically conductive contact layers 15, 16 are connected to the electrically conductive field distribution assemblies 19, 20 via through contacts 5, 6.

The field distribution assemblies 19, 20 have edges 8, 9 that are very thin. In the exemplary embodiment shown, the edges 8, 9 are arranged completely in the inside of the mounts 17, 18. A high electric field strength can form at the edges 8, 9.

The electrical conductor 13 has a diameter c. The diameter c is preferably (significantly) smaller than the width b of the field distribution assemblies 19, 20. The width b of the field distribution assemblies 19, 20 is in turn preferably (significantly) smaller than the width a of the cutouts 23, 24.

Figure 2:
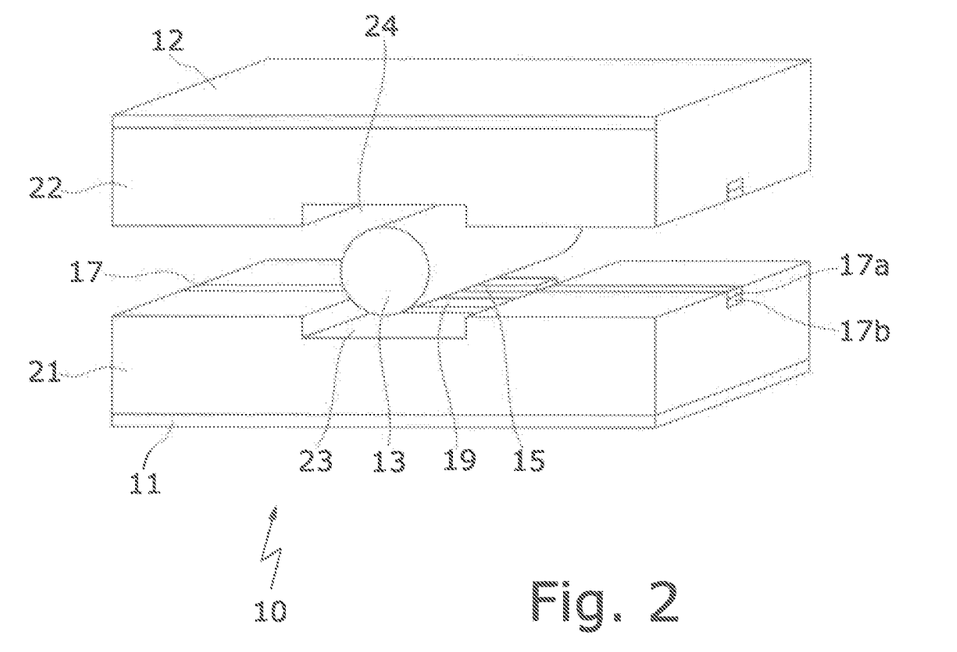
FIG. 2 shows a perspective partial view of the device according to the invention.

FIG. 2 shows a perspective illustration of the arrangement in accordance with FIG. 1. It is clearly discernible here that the electrical conductor 13 is held exclusively by the mounts 17, 18 in the device 10 and is in contact only with the contact units 15, 16 from the mounts 17, 18. Furthermore, it is discernible that the mounts 17, 18 are configured in web-like fashion and bridge the cutouts 23, 24. Moreover, it is discernible that the mount 17 has two parts 17a, 17b. The mount 18 can be constructed correspondingly.

Figure 3:
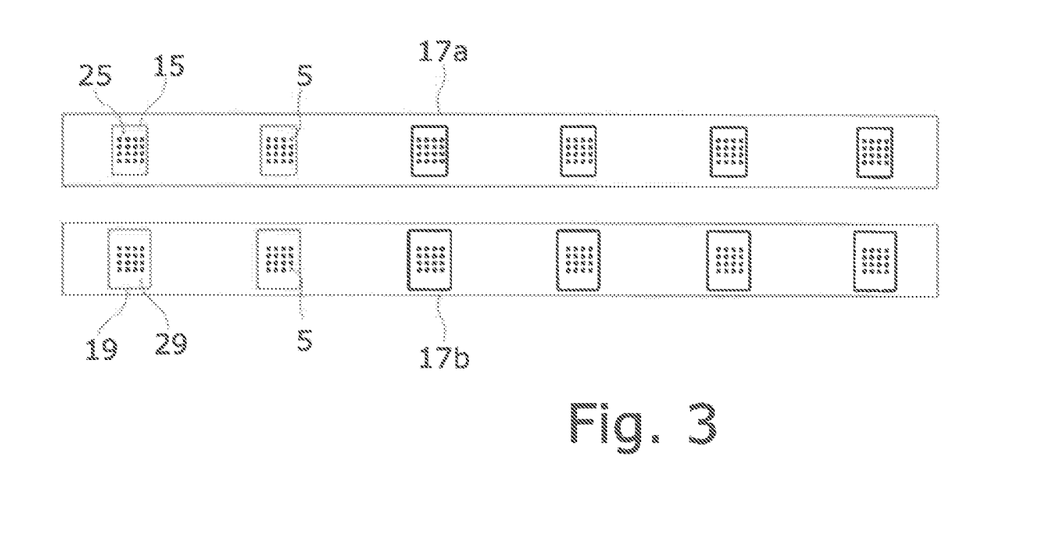
FIG. 3 shows an illustration for elucidating the contacting on a mount.

FIG. 3 shows two parts 17a, 17b of the mount 17. Both mount parts 17a, 17b are configured in electrically insulating fashion. Both mount parts 17a, 17b are configured in planar fashion and preferably have the same thickness. The mount parts 17a, 17b can enclose the field distribution assembly 19 between them. The mount 17 can be produced by the mount parts 17a, 17b being pressed together. In particular, the mount parts 17a, 17b can be layers of a multilayer printed circuit board. The field distribution assembly 19 can be arranged in an inner layer of the printed circuit board. Furthermore, it is discernible that the contact unit 15 has a contact area 25. The through contacts 5 can be arranged in the form of a matrix. Accordingly, the field distribution assembly 19 can have a field distribution area 29. The field distribution area 29 and the contact area 25 can be arranged parallel and at a distance from one another. In particular, the areas 25, 29 can be arranged in an overlapping fashion. Preferably, for this purpose, the area 29 is made larger than the area 25.

Figure 4:
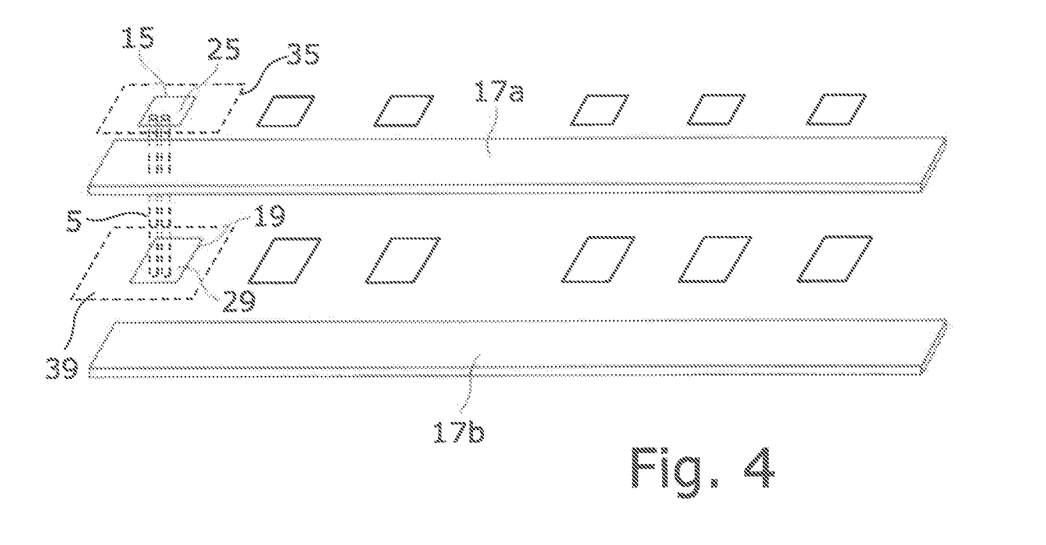
FIG. 4 shows an illustration for elucidating the through contacting.

FIG. 4 shows an exploded illustration of the mount 17 with the mount parts 17a, 17b. It is discernible here that the contact area 25 is arranged in a contact plane 35 and the field distribution area 29 is arranged in a field distribution plane 39.

Figure 5:
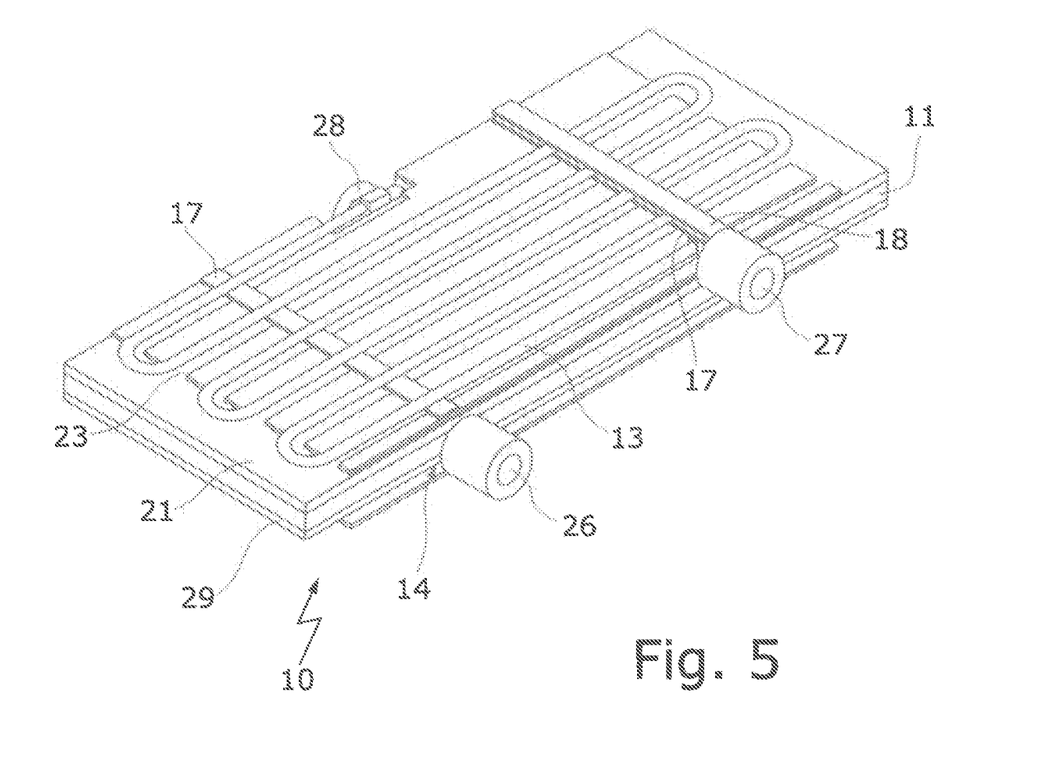
FIG. 5 shows a perspective partial illustration of a device configured as a combiner.

FIG. 5 shows the device 10 comprising the ground body 11 in an embodiment as a combiner or coupler comprising two power terminals 26, 27 and an output terminal 28. Electrical power can be coupled in at the power terminals 26, 27, which are connected to electrical conductors 13, 14. The powers respectively coupled in at the two power terminals 26, 27 can be phase shifted by 0° and can be coupled by the device 10 to form a coupled power and output at the output terminal 28. It is discernible that the conductor 13 is arranged in a meandering fashion and makes contact with the mounts 17, 18 at a plurality of points. Accordingly, the conductor 14 is arranged in a meandering fashion and is in contact with assigned mounts likewise only at points.

The ground body 11 has insulators 21, 29 on opposite sides. In an embodiment, the device 10 comprises a further ground body in each case at the top and bottom. The other elements of the device 10 are the same reference numerals as in the previous illustration.

Figure 6:
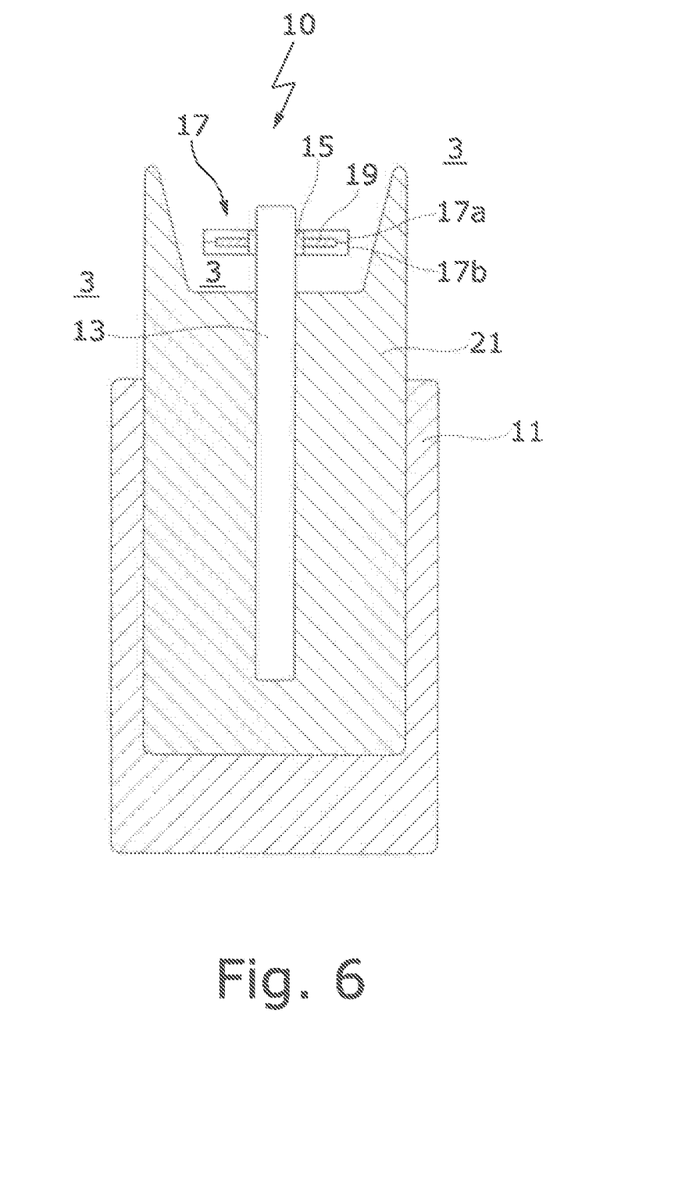
FIG. 6 shows an illustration of a further device according to the invention in the form of a measuring unit.

FIG. 6 shows an illustration of a further device 10 according to the invention in the form of a measuring unit. The electrical conductor 13 is press-fitted in cylindrical form into the likewise cylindrical insulator 21, preferably in a manner avoiding gases between insulator 21 and conductor 13. However, the electrical conductor 13 protrudes from the insulator 21 in a manner governed by its function. The insulator 21 has elevated portions all around the protruding conductor 13 in order to prevent a flashover from the conductor 13 to the ground body 11. The ground body 11 is embodied in tubular fashion and encloses the cylindrical insulator 21 in the lower region. During operation with high voltage of greater than 1 kV peak voltage, it has been found that ionizations and discharges occur at the electrical conductor 13 in the upper region situated in the gaseous environment 3, namely air. Increasing the radius of the electrical conductor 13 would have reduced the field strength. However, the radius of the electrical conductor 13 was not able to be made larger owing to the dictates of its function. Thus, here as well recourse was had to the solution according to the invention and a disk-shaped circular mount 17 configured as a printed circuit board was provided. The mount 17 is constructed from two congruent parts 17a, 17b pressed together. In the middle of the mount 17 the latter has a hole, which is embodied such that it can be mounted onto the conductor 13 with a fixed fit. Situated inside the hole there is a metallic coating as contact unit 15. The latter is electrically contacted with a field distribution assembly 19, which is arranged in the inside of the mount 17 and is pressed in a gas-free manner. With this device it was possible to attenuate the electric field at the conductor 13 in the gaseous environment and to reduce the high field strengths there. The high field strength that forms at the outer edge of the field distribution assembly 19 can be neutralized by the preferably gas-free pressing in the inside of the mount 17.

The invention claimed is:

1. A radio-frequency high-voltage waveguide device comprising:
    an electrical conductor configured for operation with a radio-frequency field and a high voltage relative to a gaseous environment and/or a ground body;
    an electrically conductive contact unit that is in contact with the electrical conductor at least one point, the electrically conductive contact unit being arranged on an electrically insulating mount; and
    an electrically conductive field distribution assembly arranged on the electrically conductive contact unit, the electrically conductive field distribution assembly being electrically conductively connected to the electrically conductive contact unit and arranged at least partly in an inside of the electrically insulating mount, wherein the electrically conductive field distribution assembly has a field distribution area in a field distribution plane, the field distribution area being greater than a cross-sectional area of the electrical conductor.

2. The device as claimed in claim 1, wherein the electrically conductive contact unit has a contact area in a contact plane, and wherein the field distribution area and the contact area are arranged parallel at a distance and in an overlapping configuration perpendicular to the field distribution plane and the contact plane.

3. The device as claimed in claim 2, wherein the field distribution area has an area which is greater than or equal to the contact area.

4. The device as claimed in claim 1, wherein the electrically conductive field distribution assembly is embedded, without gas inclusions, in the electrically insulating mount.

5. The device as claimed in claim 1, wherein the electrically insulating mount is configured as a multilayer printed circuit board.

6. The device as claimed in claim 1, wherein an insulator is arranged between the electrically insulating mount and the ground body.

7. A radio-frequency high-voltage waveguide device comprising:
    an electrical conductor configured for operation with a radio frequency and a high voltage relative to a gaseous environment and/or a ground body;
    an electrically conductive contact unit that is in contact with the electrical conductor at at least one point, the electrically conductive contact unit being arranged on an electrically insulating mount;
    an electrically conductive field distribution assembly arranged on the electrically conductive contact unit, the electrically conductive field distribution assembly being electrically conductively connected to the electrically conductive contact unit and arranged at least partly in an inside of the electrically insulating mount; and
    an insulator arranged between the electrically insulating mount and the ground body, wherein the insulator has a cutout in a region of the contact area, the cutout being bridged by the electrically insulating mount.

8. The device as claimed in claim 1, further comprising two ground blocks, wherein the electrical conductor is arranged between the two ground blocks, and is in contact with the electrically conductive contact unit on the electrically insulating mount at opposite points.

9. A radio-frequency high-voltage waveguide device, comprising:
    an electrical conductor configured for operation with a radio frequency and a high voltage relative to a gaseous environment and/or a ground body;
    a plurality of electrically conductive contact units that are in contact with the electrical conductor at different points, and
    a plurality of field distribution assemblies, each respective field distribution assembly being electrically conductively connected to a respective electrically conductive contact unit.

10. The device as claimed in claim 5, wherein the electrically insulating mount is configured to be heated by the radio-frequency field.

11. The device as claimed in claim 1, wherein the electrical conductor is configured as an impedance-controlled line.

12. The device as claimed in claim 1, comprising a second electrical conductor, the electrical conductor and the second electrical conductor being arranged in different planes of the device and respectively connected to a power terminal for radio-frequency power, wherein the electrical conductor and the second electrical conductor are electrically connected to one another at a second terminal and that is connected to a coupling terminal for a coupled power signal.

13. The device as claimed in claim 12, wherein there is connected between a plurality of power terminals a respective balancing resistor from each power terminal to a star point.

14. The device as claimed in claim 12, wherein the electrical conductor and the second electrical conductor each have a length of 2λ or an integer multiple of λ/4 of the radio-frequency power.

15. The device as claimed in claim 1, wherein the electrical conductor is configured for operation with a radio frequency that is greater than or equal to 1 MHz and less than or equal to 500 MHz.

16. The device as claimed in claim 13, wherein each balancing resistor has a resistance value equal to the line impedance of 25 Ω, 50Ω, or 100 Ω.

* * * * *